Sept. 1, 1970 W. R. WILLIAMS ET AL 3,526,810

AMPLIFIER PROTECTION CIRCUIT

Filed March 7, 1967 2 Sheets-Sheet 1

INVENTORS.
WILBUR R. WILLIAMS
GERALD DUFRENNE
By White & Haefliger
ATTORNEYS.

INVENTORS
WILBUR R. WILLIAMS
GERALD DUFRENNE
By White & Haefliger
ATTORNEYS.

3,526,810

AMPLIFIER PROTECTION CIRCUIT

Wilbur R. Williams, Glendora, and Gerald Dufrenne, La Verne, Calif., assignors to Cary Instruments, Monrovia, Calif., a corporation of California Filed Mar. 7, 1967, Ser. No. 621,265
Int. Cl. H02h *3/20, 7/20;* G01r *1/36*
U.S. Cl. 317—16 6 Claims

ABSTRACT OF THE DISCLOSURE

The invention concerns overload protection for field effect transistors in fast, high impedance circuits, the environment including the field effect transistor connected in an amplifying network. The improvement comprises first means operable to detect increase of network output in relation to a predetermined level, and second means responsive to operation of the first means to effect feedback application of override voltage combining with input voltage to maintain the voltage at the control terminal below destructive level.

This invention relates generally to overload protection circuits and more specifically concerns the protection of high impedance voltage controlled devices such as field effect transistors against overload, and particularly in their application to mass spectrometer and electrometer circuitry.

The breakdown voltage at the input of a conventional field effect transistor (FET) is relatively low, i.e. on the order of around 60 volts. This circumstance imposes serious limitations on the use of such devices in high impedance circuit applications, such as mass spectrometers and electrometers. Thus, where relatively high speed response (for example faster than 20 milliseconds) and high input impedance are both required, conventional overload protection systems are inadequate because this same combination of restraints is imposed upon the elements of the protection system; for example, the "disconnect" component must operate with high speed and also have exceedingly high insulation resistance. In particular, conventional relays are too slow in operation and their insulation resistance is much too low. Also, back-to-back diodes connected to shunt excessive input voltage are too noisy, their insulation resistance is too low, and they add too much variable input capacitance. Accordingly, the employment of field effect transistors to fullest advantage has been exceedingly difficult or impossible of accomplishment in applications such as described as well as other applications.

It is a major object of the present invention to obviate these difficulties through provision of completely automatic, positive overload protection for field effect transistors in fast, high impedance circuits. Basically, the environment of the invention concerns a system that includes a first input terminal to receive a source signal, and an amplifying network including a voltage controlled device having a control terminal electrically connected with the first input terminal to receive input voltage and also having a pair of terminals through which current passage is controlled by the voltage at the control terminal. Where the voltage controlled device comprises an FET, the control terminal is typically the transistor gate and the other pair of terminals are typically the transistor source and drain terminals.

The inventive improvement in the above environment broadly comprises first means operable to detect increase of network output in relation to a predetermined level, and second means responsive to operation of the first means to effect feedback application of override voltage combining with the input voltage to maintain the voltage at the control terminal below destructive level. As will appear, the override voltage typically combines with the input voltage in subtraction sense so as to lower the total voltage at the control terminal when a threshold detector senses that network output voltage has increased to a predetermined level.

Further, the above mentioned second means typically includes a time delay operable as amplifier network output approaches saturation to increase substantially the delay in transmission of source signal changes to the control terminal. The time delay reduces the rate of rise of source voltage at the control terminal to allow the application of override voltage to take effect at the control terminal before the source voltage at the control terminal can rise too closely to breakdown levels. As will be seen, the provision of a time delay in the form of a high resistance and a shunt capacitance in this environment is unusual, inasmuch as normally such resistance would be considered to attenuate the source signal to undesirable extent, and the capacitance would be normally considered as not needed. It should also be noted that the invention makes provision for "unlatching" or disabling of the application of override voltage as described at such time as excessive input signal is removed (network output voltage falls below predetermined threshold level). During normal operation of the system, the above mentioned time delay does not appreciably delay appliaction of the source signal to the control terminal of the FET.

Further objects of the invention include the provision of time delay means including passive impedance to increase from substantially less than to greater than the time constant of the amplifying network as network output increases from substantially less than saturation to saturation levels; the provision of an override voltage source and a high speed relay responsive to operation of the threshold detector to effect electrical connection of the override voltage source with the control terminal; the application of the invention to mass spectrometer and electrometer environment; and the provision of combinations of circuit elements having unusually effective modes of operation and producing unusually advantageous results, as will be described in detail.

These and other objects and advantages of the invention, as well as the details of illustrative embodiments, will be more fully understood from the following detailed description of the drawings, in which.

Figure 1:
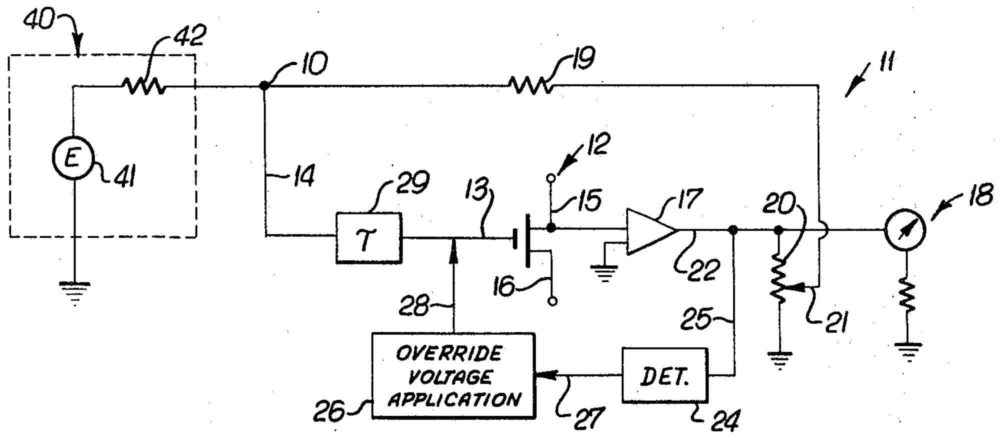
FIG. 1 is a block diagram showing certain aspects of the invention.

Referring first to FIG. 1, the illustrated system includes a first terminal 10 to receive a source signal, and an operational amplifying network 11 including a voltage controlled relatively high impedance device such as FET 12. That device has a control terminal such as gate 13 electrically connected with the first input terminal 10, as via lead 14, to receive input voltage, and the device also has a pair of terminals, such as source and drain 16 and 15, through which current passage is controlled by the voltage at the control terminal 13. The operational amplifier is also shown as including an amplification stage 17 the input to which is controlled by the FET output, suitable readout circuitry being indicated at 18.

The operational amplifying network 11 also includes feedback resistance 19 and a load in the form of output voltage divider resistance 20. The difference between the voltage developed by the flow of current from input terminal 10 through resistance 19 and the fractional output voltage of the amplifier tapped off at 21 at the divider appears at lead 14 for application to the control terminal 13. The output voltage of the amplifying network, of opposite polarity with respect to the input voltage, appears at lead 22 for application to the divider resistance 20, and also to the readout device 18.

In accordance with the invention, first means is provided to detect increase of network output in relation to a predetermined level. For example, the threshold detector 24 seen in FIG. 1 has its input connected at 25 to the output side of amplifier 17 so as to detect the increase of amplifier output to positive or negative predetermined threshold levels. Also, the invention includes second means responsive to operation of such first means (such as detector 24) to effect feedback application of override voltage combining with the input voltage to maintain the voltage at control terminal 13 below destructive level. Such second means is indicated generally at 26, having input connection at 27 with the detector 24 and having output connection at 28 with the control terminal 13.

Also shown in FIG. 1 is a time delay means, indicated generally at 29, connected between source terminal 10 and control terminal 13 to increase substantially the delay in transmission of input voltage changes to the control terminal as amplifier network output approaches saturation.

Figure 3:
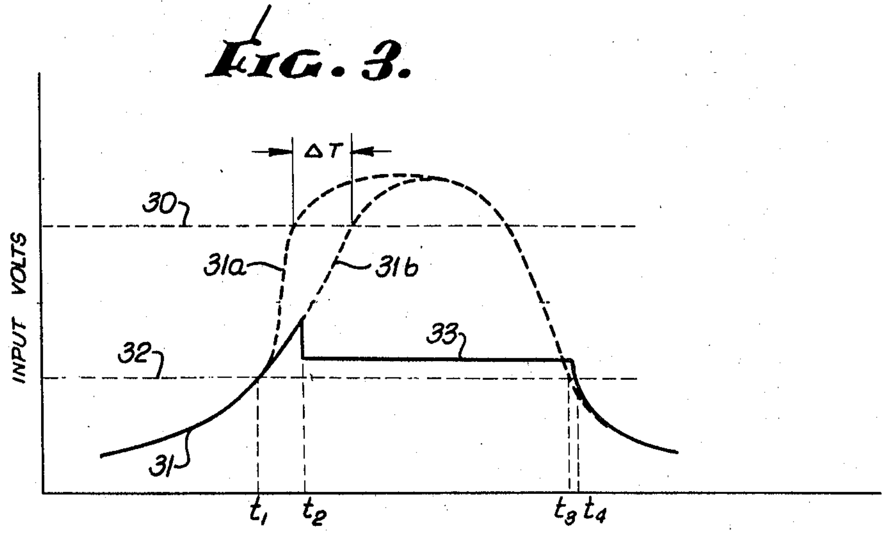
FIG. 3 is a waveform illustrating one mode of operation of the invention.

FIG. 3 shows graphically one mode of operation of the invention. A breakdown or destructive level of FET input voltage is indicated at 30 with input voltage at control terminal 13 rising at 31 toward that level. At time $t_1$ the amplifier output voltage (not shown) reaches predetermined threshold level corresponding to input voltage level 32. At time $t_2$ the inverted override voltage is applied or injected at control terminal 13 to subtract from the input voltage at that terminal, and the resultant voltage at terminal 13 is then maintained well below destructive level 30, as for example at level 33, the period $t_2$ to $t_4$ of such maintenance of override voltage application being referred to as the "latch" period.

It will be noted that the time delay becomes effective at about $t_1$ when the network output rises to threshold level, the effect of the time delay being to shift the input voltage rise curve from 31*a* to 31*b*, giving time for the latch to occur at $t_2$ well before the input voltage at control terminal 13 can rise along curve 31*b* to destructive level 30. If the time delay were not so operative, the input voltage could rise along curve 31*a* to reach destructive level before latch could occur.

The above delay is effectively present in the circuit only when the amplifier is in overload condition, i.e. when the output is saturated (above threshold level). For example, the output may become saturated one millisecond or less after application of an overload signal to the control terminal 13. During normal operation when the amplifier is not overloaded, the operation of the FET 12, amplifier 17, and feedback resistor 19 and 20 circuit in effect reduces the time constant of the delay 29 by a factor equal to about the loop again, as for example 1,000, as is required for optimal amplifier speed response during normal operating conditions. The delay introduced at 29 is in effect automatically inserted between 10 and 13 at $t_1$ when the amplifier output reaches saturation (as for example 1½ full scale); at that moment, the input voltage at the FET control terminal 13 is only a small fraction of that which would cause breakdown. Thus, the delay is effective between source 10 and FET control terminal 13 after the initial application of an overload signal but before it has had a chance to become destructive. Also, the time delay means 29 typically increases the time delay from substantially less than to greater than the time constant of the amplifying network as the amplifier network output increases from less than saturation to saturation. Thus, the time delay approaches a value $\Delta T$ as represented by intersection of curves 31*a* and 31*b* with level 30, $\Delta T$ being greater than $(t_2-t_1)$.

FIG. 1 further shows application of the illustrated circuitry to measurement of the output of a current source 40, which may for example be a collecting apparatus of a mass spectrometer. Source 40 as illustrated includes a voltage source 41 whose output is connected through resistance 42 with the source terminal 10. This is a representation of an equivalent circuit of a mass spectrometer output. As previously stated, the present invention is particularly advantageous for measuring the output of devices, such as mass spectrometers, whose characteristics demand measuring circuitry with high response speed (as for example faster than about 20 milliseconds) and high input impedance.

Figure 2:
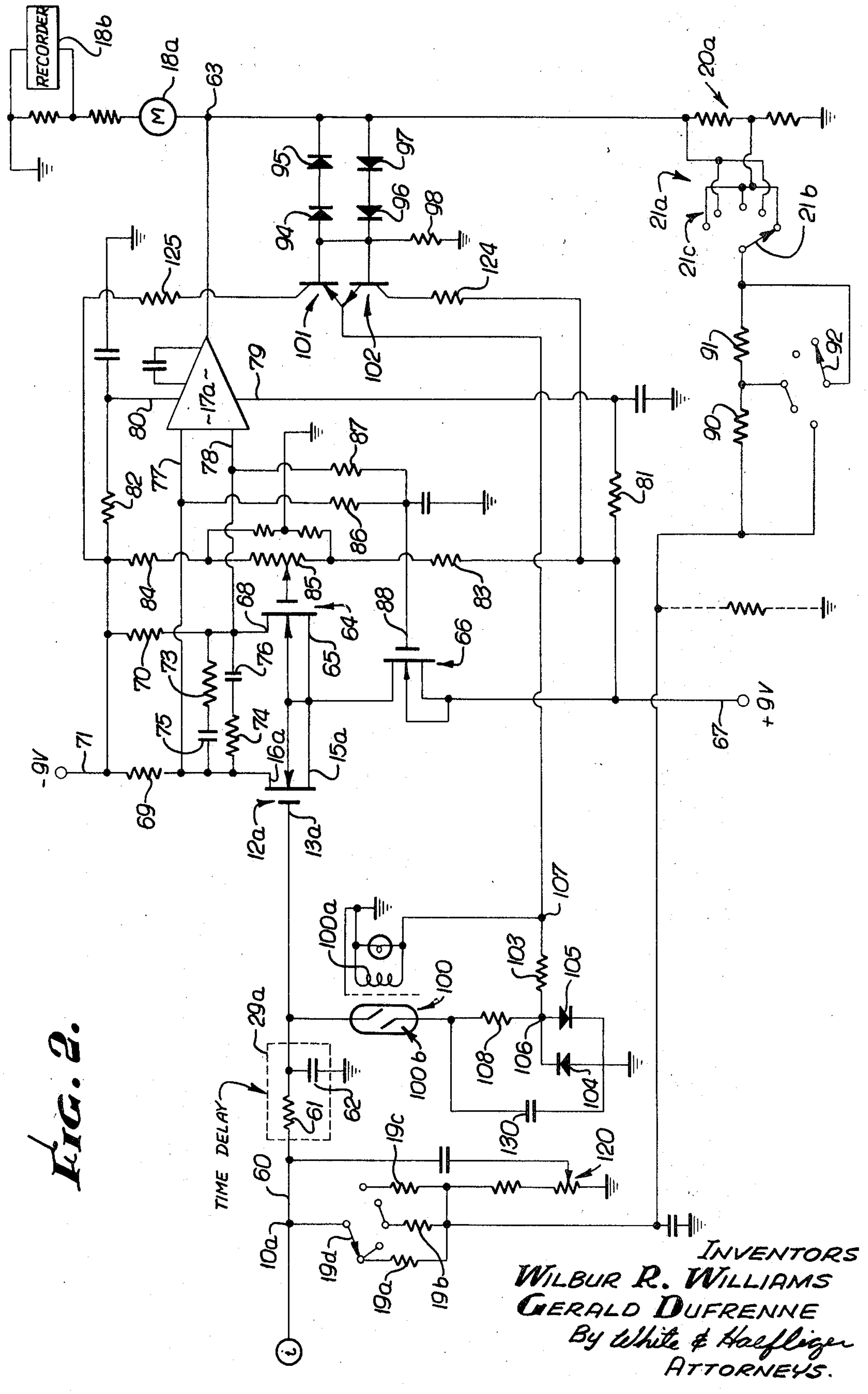
FIG. 2 is a circuit diagram illustrating one preferred embodiment of the FIG. 1 block diagram.

Referring now to FIG. 2, the first terminal 10*a* at which the source signal appears is connected via lead 60 with the field effect transistor 12*a*, so that input voltage appears at the control terminal or gate 13*a*. The time delay 29*a* connected as shown includes a very high impedance resistor 61 and a capacitor 62, functioning as described above.

The output of the amplifying network that includes the FET 12*a* appears at 63. That network also includes the amplifier 17*a* and associated circuitry as shown. In this regard, a second or reference FET 64 is connected as shown so that the source terminals 15*a* and 65 of both FETs are connected through third FET 66 with positive voltage at 67, and drain terminals 16*a* and 68 are connected via bias resistors 69 and 70 with negative voltage at 71. The drain terminals are also interconnected via resistance capacitance networks including resistors 73 and 74 and capacitors 75 and 76 as shown, and differential voltages appearing at those terminals are impressed upon amplifier 17*a* at input points 77 and 78. The amplifier also has terminals 79 and 80 respectively connected with voltage points 67 and 71 via resistors 81 and 82 as shown.

To complete the description of the circuitry associated with amplifier 17*a*, the gate of FET 64 is supplied with voltage via divider that includes resistances 83 and 84, and potentiometer resistance 85, to set the level of reference voltage applied via FET drain 68 to amplifier input point 78. Points 77 and 78 are connected via resistors 86 and 87 with the gate 88 of FET to control current flow via the source and drain terminals of FETs 12*a* and 64, for stability.

The voltage divider resistance 20 of FIG. 1 has its counterpart at 20*a* in FIG. 2, with various voltage level taps provided by selector switch 21*a* including arm 21*b* and terminals 21*c*. The readout 18 of FIG. 1 is represented by meter 18*a*, and a recorder may be provided at 18*b*. The feedback resistor 19 of FIG. 1 is represented by various resistances 19*a*, 19*b* and 19*c* of FIG. 2, which may be alternately selected by means of switch 19*d*, typically an electrometer sensitivity switch. The overall scale of display of the readous devices may be adjusted as desired by the user through appropriate selection of the positions of switches 21*b* and 19*d*, which may be ganged together. Inclusion of various resistors 90 and 91 in the feedback loop is secured by switch 92 operated in synchronism with switch 19*d*, thereby to maintain the time-constant characteristics required for proper operation of the amplifier and associated circuitry. In this regard, the time delay $\Delta T$ introduced by components 61 and 62 during amplifier overload (output saturated) condition may typically be about two milliseconds, whereas the amplifier and associated circuitry may have a time constant of about one millisecond.

The threshold detector 24 of FIG. 1 is represented in FIG. 2 by the groups of diodes 94–97 and load resistor 98, the diodes conducting when positive or negative output voltages exceed predetermined levels.

The means 26 of FIG. 1 is represented in FIG. 2 by an override voltage source and a relay 100 responsive to operation of the detector to effect application of the override voltage source with the control terminal 13*a*. That source in FIG. 2 includes transistors or gates 101 and 102, resistance 103 and override voltage maintenance diodes 104 and 105 connected in circuit to pass current and develop voltage at point 106 when the detector detects increase of network output voltage to predetermined positive level, and also when the detector detects increase of network output voltage to predetermined negative level. The transistor collectors are connected with the positive and negative voltage points 67 and 71 as shown, via resistors 124 and 125. In this regard, the transistors 101 and 102 are turned on by the detector in response to detector operation as described, and amplified current from one or the other of the transistors flows through resistor 103 and one or the other of the diodes 104 and 105. Voltage at point 107 is picked off to operate the relay coil 100*a*, which when energized causes closing of the relay contacts 100*b*, connecting the control terminal 13*a* with voltage point 106 via resistor 108, to provide the override voltage as described. Because resistors 103 and 108 offer substantially less impedance than feedback resistors 19*a*, 19*b* and 19*c*, the override circuitry takes over control of the voltage at the control terminal during output saturation conditions. Bandwidth adjustment is provided at 120.

The relay switch 100*b* must be a very fast, high insulation-resistance device. One example of such a device, having insulation resistance on the order of $10^{14}$ ohms, is manufactured by Western Electric Company, Inc. and identified as 6A–53736, L1 "Magnetic reed contact set."

The following values for the circuit components of FIG. 2 are representative only:

FET's:
- 12*a*
- 64—F 10049
- 66—F1 100

Amplifier 17*a*—MC 1530

Diodes:
- 94—IN 270
- 95—IN 270
- 96—IN 270
- 97—IN 270
- 104—IN 270
- 105—IN 270

Resistors:
- 61—$2\times10^{8}\Omega$
- 69—10KΩ
- 70—10KΩ
- 73—680Ω
- 74—120Ω
- 81, 82, 83, 84—100Ω
- 85, 121, 122—10KΩ
- 86, 87—1 megohm
- 124, 125—10KΩ
- 90, 91
- 20*b*—9KΩ
- 20*c*—1KΩ
- 103—2.2KΩ
- 108—4.7 megohm
- 131

- 19*a*—$10^{10}\Omega$
- 19*b*—$10^{8}\Omega$
- 19*c*—$10^{6}\Omega$ Capacitors:
- 62—10 pf.
- 75—.47 μf.
- 76—.1 μf.
- 123, 130—.047 μf.
- 126—150 μf.
- 127—.002 μf.
- 128—150 pf.

We claim:

1. In a system that includes a first input terminal to receive a source signal which has a characteristically relatively small signal level but which may at times include relatively large superimposed transients, and an amplifying network including a voltage controlled device having a control terminal electrically connected with said first input terminal to receive input voltage and also having terminals through which current passage is controlled by the voltage at said control terminal, said device being susceptible to partial or complete destruction by application of such transients, the improvement comprising:

(a) first means operable to detect increase of network output in relation to a predetermined level, and (b) second means responsive to operation of said first means to effect feedback application of override voltage combining with said input voltage to prevent such input transients from elevating the voltage at said control terminal to a destructive level, and including a feedback path electrically connected between the network output and input, and time delay means connected to increase substantially the delay in transmission of source signal changes to said control terminal as amplifier network output approaches saturation.

2. The system of claim 1 in which said time delay means includes passive impedance to increase said delay from substantially less than to greater than the time constant of said amplifying network as the amplifier network output increases from substantially less than saturation to saturation.

3. The system of claim 1 in which said device comprises a field-effect transistor wherein said control terminal is defined by the transistor gate.

4. In a system that includes a first input terminal to receive a source signal, and an amplifying network including a voltage controlled device having a control terminal electrically connected with said first input terminal to receive input voltage and also having terminals through which current passage is controlled by the voltage at said control terminal, the improvement comprising:

(a) first means operable to detect increase of network output in relation to a predetermined level, and (b) second means responsive to operation of said first means to effect feedback application of override voltage combining with said input voltage to maintain the voltage at said control terminal below destructive level, said first means including a threshold detector operatively connected to said network to control said second means, thereby to effect said application of override voltage to the control terminal when the network output voltage increases to said predetermined level, said second means including an override voltage source and a relay responsive to operation of said detector to effect electrical connection of said override voltage source with said control terminal.

5. The system of claim 4, in which said override voltage source includes diode, gate and resistance elements connected to pass current and develop voltage when the detector detects increase of network output voltage to predetermined positive level and also when the detector detects increase of network output voltage of predetermined negative level.

6. The system of claim 4 in which said relay includes a fast reed switch.

References Cited

UNITED STATES PATENTS

| | | | |
|---|---|---|---|
| 3,200,346 | 8/1965 | Young. | |
| 3,264,569 | 8/1966 | Lefferts | 330—26 X |
| 3,281,718 | 10/1966 | Weberg | 330—38 X |
| 3,300,659 | 1/1967 | Watters | 317—31 X |
| 3,320,533 | 5/1967 | Watters | 330—38 X |
| 3,390,306 | 6/1968 | White | 317—31 X |

FOREIGN PATENTS

| | | |
|---|---|---|
| 149,629 | 7/1962 | U.S.S.R. |

J D MILLER, Primary Examiner

W. H. BEHA, Jr., Assistant Examiner

U.S. Cl. X.R.

317—33; 330—11; 324—110